United States Patent
Wu et al.

(10) Patent No.: US 11,532,357 B2
(45) Date of Patent: Dec. 20, 2022

(54) MEMORY CELL WITH TEMPERATURE MODULATED READ VOLTAGE

(71) Applicant: Taiwan Semiconductor Manufacturing Co., Ltd., Hsin-Chu (TW)

(72) Inventors: Chao-I Wu, Zhubei (TW); Win-San Khwa, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/149,985

(22) Filed: Jan. 15, 2021

(65) Prior Publication Data

US 2022/0230680 A1 Jul. 21, 2022

(51) Int. Cl.
  *G11C 11/00* (2006.01)
  *G11C 13/00* (2006.01)
(52) U.S. Cl.
  CPC ........ *G11C 13/004* (2013.01); *G11C 13/0004* (2013.01); *G11C 2013/0054* (2013.01)
(58) Field of Classification Search
  CPC .............. G11C 13/004; G11C 13/0004; G11C 13/0054
  USPC ...................................................... 365/163
  See application file for complete search history.

(56) References Cited

U.S. PATENT DOCUMENTS

| 6,868,025 | B2 * | 3/2005 | Hsu ..................... G11C 11/5685 |
|   |   |   | 365/213 |
| 7,885,101 | B2 * | 2/2011 | Bedeschi ................ G11C 11/56 |
|   |   |   | 365/163 |
| 8,659,966 | B2 | 2/2014 | Choi et al. |
| 10,019,188 | B2 | 7/2018 | Chung et al. |
| 10,176,881 | B2 * | 1/2019 | Kim ........................ G11C 7/04 |
| 2010/0165712 | A1 | 7/2010 | Bedeschi et al. |
| 2013/0070519 | A1 | 3/2013 | Lin et al. |
| 2013/0272063 | A1 | 10/2013 | Bedeschi et al. |
| 2016/0099049 | A1 * | 4/2016 | Lee ..................... G11C 13/0064 |
|   |   |   | 365/148 |
| 2017/0243639 | A1 | 8/2017 | Kang et al. |
| 2018/0061504 | A1 | 3/2018 | Kim et al. |

* cited by examiner

*Primary Examiner* — Tha-O H Bui
(74) *Attorney, Agent, or Firm* — Eschweiler & Potashnik, LLC

(57) ABSTRACT

An integrated chip has an array of memory cells disposed over a semiconductor substrate and a driver circuit. The driver circuit provides the array with a read voltage that varies in relation to an approximate temperature of the memory array to ameliorate temperature dependencies in read currents. The driver circuit may vary the read voltage in an inverse relationship with temperature. The read voltage may be varied continuous or stepwise and the driver circuit may use a table lookup. Optionally, the driver circuit measures a current and modulates the read voltage until the current is within a target range. The memory cells may be multi-level phase change memory cells that include a plurality phase change element disposed between a bottom electrode and a top electrode. Modulating the read voltage to reduce temperature-dependent current variations is particularly useful for multi-level cells.

20 Claims, 7 Drawing Sheets

MEMORY CELL WITH TEMPERATURE MODULATED READ VOLTAGE

BACKGROUND

Many electronic devices contain electronic memory configured to store data. Electronic memory may be volatile or non-volatile. Volatile electronic memory uses power to maintain data whereas non-volatile memory is able to store data without power. Flash memory is a widely used type of nonvolatile memory. However, flash memory is thought to have scaling limitations. For that reason, there has been a long felt need for alternatives types of nonvolatile memory. Among those alternatives is phase change memory (PCM). Phase change memory is a type of nonvolatile memory in which a phase of a phase change element is employed to represent a unit of data. Phase change memory has fast read and write times, non-destructive reads, and high scalability. Phase change memory also has the potential to store multiple bits per cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
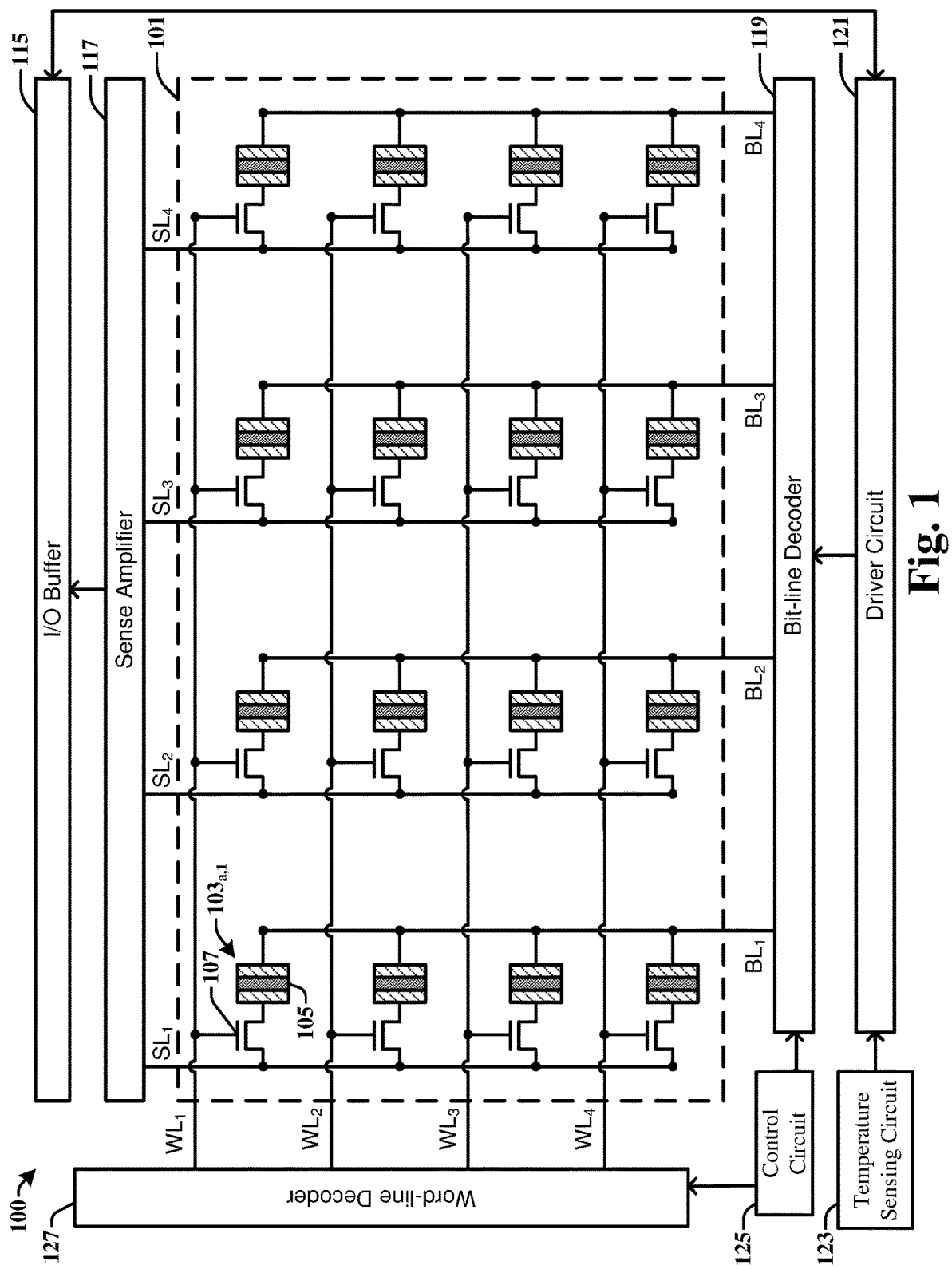
FIG. 1 is a block diagram of a phase change memory circuit that provides a temperature-dependent read voltage in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A phase change memory (PCM) cell includes at least one phase change element between a bottom electrode and a top electrode. The phase change element has a crystalline state and an amorphous state with different electrical resistivities. These different resistance states may be used to represent data. For example, the amorphous state, which is the high resistance state, can correspond to a logical "0". The crystalline state, which is the low resistance state, can correspond to a logical "1". These different resistance states may be referred to as programming states of the cell. Partially crystalline states with intermediate levels of resistance may also be formed. If four states with resistances falling into distinct ranges are consistently achievable, the phase change memory cell may be used to represent two data bits, e.g., a logical "00", a logical "01", a logical "10", and a logical "11". A cell that can store two or more data bits is referred to as a multi-level cell.

The programing state of a memory cell, and thus the data stored in the cell, may be read by applying a predetermined voltage to the cell and comparing the resulting current (the read current) to one or more reference currents. In addition to the programming state, the resistance of the cell is dependent on temperature. That temperature dependence may affect the accuracy with which the programming state of the cell is read. The temperature dependency of the current may be accounted for by adjusting the reference currents based on temperature. The present disclosure, however, teaches reducing temperature-dependent variations in the read current by adjusting the predetermined voltage used for read operations. This approach may be implemented with comparatively simple circuitry and reduces error rates. These benefits are particularly strong for multi-level phase change memory cells. Although this disclosure is primarily focused on modulating the read voltage when reading states of phase change memory cells, the structures and methods of the disclosure may be applied to reading other types of memory cells. In some embodiments, in addition to modulating the read voltage based on temperature, one or more threshold currents to which the read current is compared are also adjusted based on temperature. The combination of these two types of temperature compensation may improve the accuracy with which different programming states are distinguished.

Typically, memory cells are arranged within a memory array in rows and columns. A read or write operation is performed on a memory cell within the memory array by activating word lines and bit lines to provide a voltage to the selected phase change memory cell. Each memory cell in the array may be associated with an access selector apparatus that substantially prevents leakage currents from flowing through non-selected memory cells.

An integrated chip according to the present disclosure has an array of memory cells disposed over a semiconductor substrate. In some embodiments, the memory cells are phase change memory cells. A phase change memory cell typically includes a heating element and a phase change element that is disposed between a bottom electrode and a top electrode. In accordance with the present teachings, a driver circuit for the array of memory cells is configured to provide a temperature-compensated read voltage, which is a driving voltage that varies in relation to a temperature in a way that reduces temperature-driven variations in a read current.

The temperature dependency of the resistance of a cell may vary according to the programming state of the cell. In some embodiments, the read voltage is temperature compensated according to the temperature dependency of the resistance of the cell in one specific programming state. In some embodiments, the read voltage is temperature compensated in relation to the temperature dependence of the cell resistance when the cell is in its highest resistance programming state. In some embodiments, the read voltage is temperature compensated in relation to the temperature dependence of the cell resistance when the cell is in its lowest resistance programming state In some embodiments, one or more threshold currents against which the read current is compared to distinguish among the programming states are also varied in relation to the temperature. While this latter approach may increase complexity, it may reduce error rates particularly for multi-level cells.

In some of these teachings, the driver circuit continuously varies the read voltage in an inverse relationship with temperature. In some of these teachings, the driver circuit varies the read voltage incrementally in relation to incremental increases or decreases in temperature. In some of these teachings, the driver circuit implements a table lookup that selects a read voltage according to a range within which the temperature falls. In some of these teachings, the driver circuit adjusts the read voltage to modulate the current through a reference phase change memory cell that is in a known programming state.

In some of these teachings, the read voltage variation is determined based on measurement of cell resistance variation with temperature obtained for a particular wafer from which the integrated chip is cut. In some of these teachings, the read voltage variation is determined based on measurement of cell resistance variation with temperature obtained using the particular integrated chip that contains the phase change memory array. These approaches may allow the read voltage to compensate for some manufacturing process variations.

Some aspects of the present teachings relate to a method of selecting a driving voltage for reading programming states of cells in a phase change memory array. According to the method, the driving voltage is modulated in relation to temperature to reduce a temperature dependent variation in a read current, which is the current through a cell of the phase change memory during a read operation in which the cell is in some particular programming state. In some embodiments, the driving voltage is adjusted in a manner that results in an increase in the driving voltage if a temperature of the phase change memory array has dropped and a decrease in the driving voltage if a temperature of the phase change memory array has risen. In some embodiments, the method includes measuring a temperature of the phase change memory array and adjusting the driving voltage based on that measurement. In some embodiments, the method includes detecting temperature-dependent variations in a current through a device and adjusting the driving voltage to reduce those variations. In some embodiments, the device is a PCM memory cell that is used as a reference cell.

FIG. 1 illustrates a block diagram of a portion of an integrated chip 100 according to some embodiments of the present disclosure. The integrated chip 100 includes a memory array 101 having a plurality of memory cells $103_{a,1}$-$103_{d,4}$. The memory cells $103_{a,1}$-$103_{d,4}$ are arranged within the memory array 101 in rows and/or columns. For example, a first row comprises the memory cells $103_{a,1}$-$103_{d,1}$, while a first column comprises the memory cells $103_{a,1}$-$103_{a,4}$. Although the memory array 101 is illustrated as having 4 rows and 4 columns, the memory array 101 may have any number of rows and any number of columns. Each of the memory cells $103_{a,1}$-$103_{d,4}$ may include a phase change memory element 105 coupled to an access selector apparatus 107. The access selector apparatus 107 is configured to selectively provide access to the phase change memory element 105 while inhibiting leakage currents through non-selected memory cells $103_{a,1}$-$103_{d,4}$.

The memory cells $103_{a,1}$-$103_{d,4}$ may be controlled through bit-lines $BL_1$-$BL_4$, word-lines $WL_1$-$WL_4$, and source-lines $SL_1$-$SL_4$. The word-lines $WL_1$-$WL_4$ may be used to operate the access selector apparatuses 107 corresponding to the memory cells $103_{a,1}$-$103_{d,4}$. When an access selector apparatus 107 for a memory cell $103_{a,1}$-$103_{d,4}$ is turned on, a voltage may be applied to that cell. It will be appreciated that the voltage of significance is an absolute value of a potential difference across the phase change memory element 105. For the integrated chip 100, applying a voltage to a selected memory cell $103_{a,1}$-$103_{d,4}$ means operating a word-line $WL_1$-$WL_4$ to turn on the access selector apparatus 107 corresponding to that memory cell and using a driver circuit 121 to make the absolute value of the potential difference between the source-line $SL_1$-$SL_4$ and the bit-line $BL_1$-$BL_4$ corresponding to that cell equal in magnitude to that voltage. In some embodiments, applying a voltage to a memory cell $103_{a,1}$-$103_{d,4}$ is accomplished by coupling a corresponding bit-line $BL_1$-$BL_4$ to the voltage while holding a corresponding source-line $SL_1$-$SL_4$ at a ground potential. Of course, source-lines $SL_1$-$SL_4$ may be held at other potentials and the roles bit-lines $BL_1$-$BL_4$ and source-line $SL_1$-$SL_4$ may be reversed.

The driver circuit 121, which may be a read/write driver, is configured to select voltages to apply to selected memory cells $103_{a,1}$-$103_{d,4}$ for read, write, and write-verify operations. The driver circuit 121 receives input from a temperature sensing circuit 123 and uses that data to select a read voltage for read operations. A bit-line decoder 119 under direction from a control circuit 125 applies the read voltage to one of the bit-lines $BL_1$-$BL_4$. The word-line decoder, also under direction from a control circuit 125, applies another voltage to one of the word-lines $WL_1$-$WL_4$, which voltage turns on the access selector apparatus 107 for the memory cells $103_{a,1}$-$103_{d,4}$ in a corresponding row. Together, these operations cause the read voltage to be applied to a selected one among the memory cells $103_{a,1}$-$103_{d,4}$.

Applying a voltage to a selected memory cell $103_{a,1}$-$103_{d,4}$ results in a current. During read operations, a sense amplifier 117 determines the programming state of the selected memory cell $103_{a,1}$-$103_{d,4}$ based on the current. The sense amplifier 117 may be connected to source-lines $SL_1$-$SL_4$. Alternatively, the sense amplifier 117 may be connected to bit-lines $BL_1$-$BL_4$. The sense amplifier 117 may determine the programming state of the memory cell $103_{a,1}$-$103_{d,4}$ based on the current. In some embodiments, the sense amplifier 117 determines the programming state of the memory cell $103_{a,1}$-$103_{d,4}$ by comparing the current to one or more reference currents. In some embodiments, one or more of the reference currents is also adjusted based on temperature. The sense amplifier 117 may convey the programming state determination to an I/O buffer 115, which may also be coupled to driver circuit 121 to implement write and write verify operations.

Figure 2:
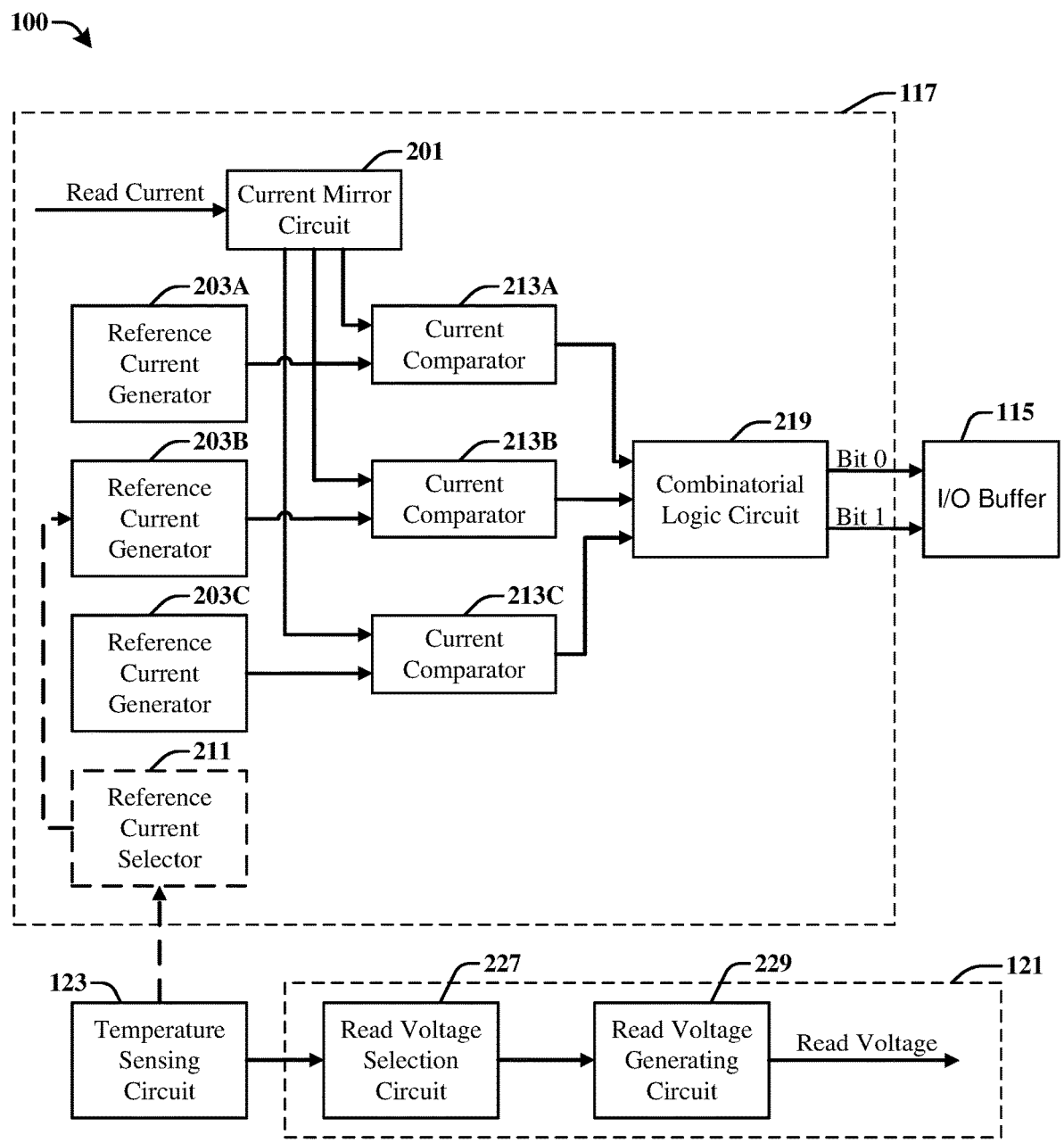
FIG. 2 is a block diagram providing further details of some components of the phase change memory circuit of FIG. 1 in accordance with some embodiments.

FIG. 2 is a block diagram showing an example with some details of some portions of the integrated chip 100, particularly of some components in the sense amplifier 117 and the driver circuit 121. These circuits may have other components that are not shown. For example, the driver circuit 121 includes components for providing a write voltage that are not shown.

As shown by this example, the driver circuit 121 may include a read voltage selection circuit 227 that may predetermine a read voltage using input from temperature sensing circuit 123. The temperature sensing circuit 123 may be activated by the driver circuit 121 to query the temperature. Alternatively, the temperature sensing circuit 123 may operate asynchronously and store temperature data that may be accessed by read voltage selection circuit 227. Where the temperature sensing circuit 123 operates asynchronously, it may update the stored temperature periodically. The period of update may be on the order of hundredths of a second, tenths of a second, second, minutes or any other suitable timing. In some embodiments, the temperature sensing circuit 123 includes an on chip temperature sensor. Alternatively, the temperature sensing circuit 123 from a temperature sensor that is located off the chip. There may be one temperature sensor for the integrated chip 100 or a greater number of temperature sensors to provide more localized measurements.

The read voltage selection circuit 227 may use any suitable structure or algorithm to select a temperature-compensated read voltage. After the temperature-compensated read voltage is selected, it may be generated by the read voltage generating circuit 229. The read voltage generating circuit may have components for generating a temperature-compensated read voltage according to a signal received from the read voltage selection circuit 227. The resulting read voltage may then be used to drive any one of the memory cells $103_{a,1}$-$103_{d,4}$ selected through the bit-line decoder 119 and the word-line decoder 127 to provide a read voltage that is processed by the sense amplifier 117.

The example sense amplifier 117 is configured to distinguish among four programming states. To distinguish among the four programming states, the sense amplifier 117 uses a current mirror circuit 201 to duplicate the read current to three distinct current comparators 213A-C. Each of the current comparators 213A-C receives a distinct reference current from a corresponding reference current generator 203A-C and produces a binary output that reflects whether the corresponding reference current is higher or lower than the read current. These binary outputs may be processed through a combinatorial logic circuit 219 to determine values of two distinct bits, Bit 0 and Bit 1, which may then be stored in I/O Buffer 115.

In some embodiments, each of the reference current generators 203A-C produces a reference current that is temperature-independent. Accordingly, the reference current generators 203A-C may each be structured to provide a fixed current, although the magnitude of that current will differ among reference current generators 203A-C. In some other embodiments, one or more of the reference current generators 203A-C produces a reference current that is temperature-dependent. In this example, reference current generator 203B is operative to produce a reference current that varies according to a signal received from reference current selector 211. Reference current selector 211 may include circuitry for selecting a reference current according to input from temperature sensing circuit 123. The reference current may be selected to improve the reliability with which two programming states are distinguished.

Figure 3A:
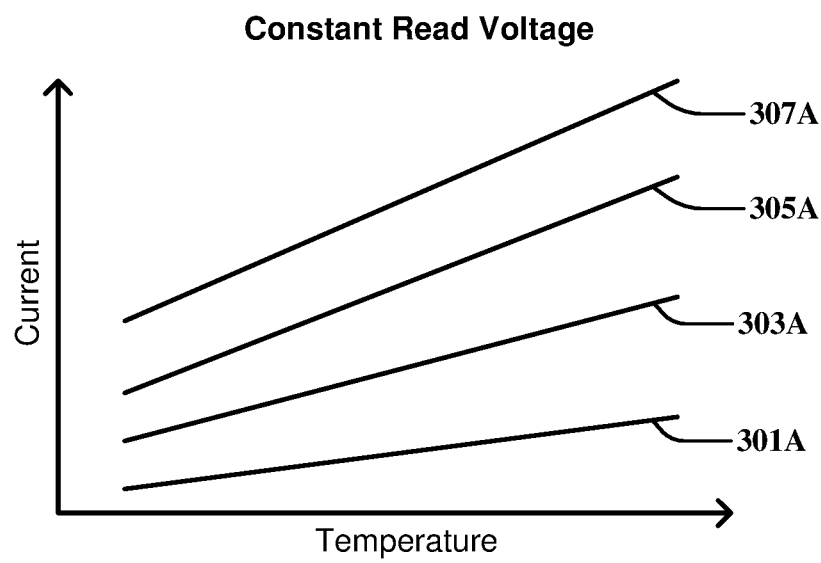
FIG. 3A is a plot showing variations of read current with temperature for four different programming states when read voltage is not modulated.

FIG. 3A shows variations with temperature of the read current that would be received by sense amplifier 117 if a fixed read voltage were applied to one of the memory cells $103_{a,1}$-$103_{d,4}$. The plot 301A shows the variation for the highest resistance state, plot 303A show the variation for the second highest resistance state, plot 305A shows the variation for the second lowest resistance state, and plot 307A shows the variation for the lowest resistance state. In each case, the current increases monotonically with increasing temperature, although other patterns of variation may also occur. In some embodiments, for some programming states, the current increases by 0.01 µA/° C. or more. In some embodiments, for some programming states, the current increases by 0.05 µA/° C. or more. If unaccounted for, these variations may cause errors or limit the operating temperature range of phase change memory.

Figure 3B:
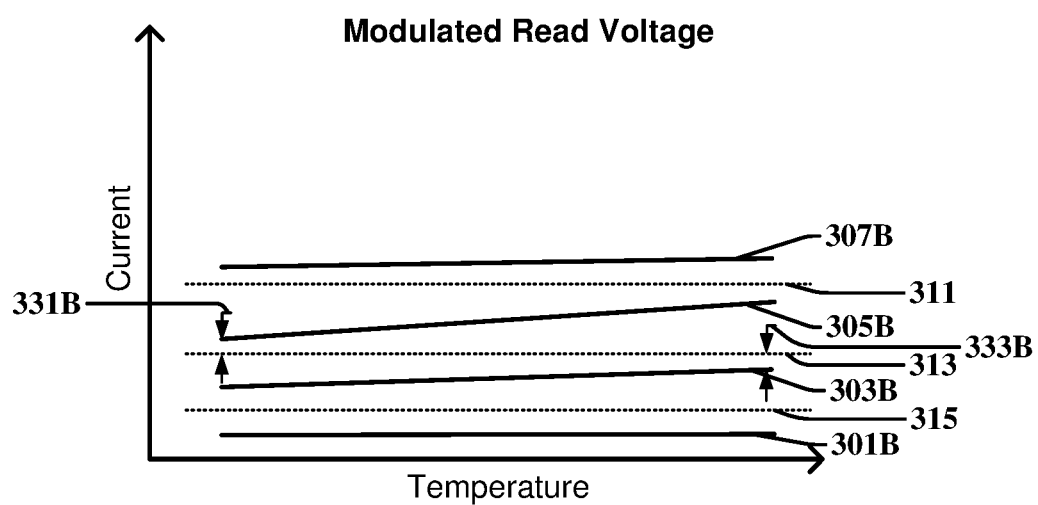
FIG. 3B is a plot showing how the variations of read current with temperature of FIG. 3A are reduced by modulating the read voltage in accordance with some embodiments of the present disclosure.

In accordance with the present teachings, the driver circuit 121 provides a temperature-compensated read voltage that ameliorate the current variation with temperature. FIG. 3B provides an example in which the read voltage has been modulated in view of the temperature dependency of the resistance of the highest resistance programming state. The result of this modulation is that the current 301B for the lowest resistance programming state remains constant across the temperature range. This modulation also substantially reduces the variation of read current with temperature for the other three programming as shown by the read currents of plot 303B, plot 305B, and plot 307B. The modulation is sufficient that the four programming states may be distinguished across the entire temperature range using three fixed reference currents: reference current 311, reference current 313, and reference current 315.

In some embodiments, modulating the read voltage reduces the read voltage by 0.1 mV or more per 1° C. increase in temperature. In some embodiments, modulating the read voltage reduces the read voltage by 0.5 mV or more per 1° C. increase in temperature. In some embodiments, modulating the read voltage reduces the read voltage by approximately 1 mV per 1° C. increase in temperature. These trends may be reversed for decreases in temperature.

In some embodiments, the read voltage is varied linearly with temperature. In some embodiments, the voltage is varied continuously whereby the read voltage, V, approximately obeys a formula:

$$V = V_0 + x(T - T_0)$$

where $V_0$ is a reference voltage, $T_0$ is a reference temperature, T is the current temperature, and x is the decrease in voltage per unit temperature change.

In some embodiments, the read voltage is reduced or increased stepwise in fixed increments. For example, the voltage may be decreased by 0.6 mV once for each 6° C. increase in temperature. Effectively, there the temperature range is divided into 6° C. intervals and a distinct voltage is applied for each interval. In some embodiments, the temperature interval size is between 0.1° C. and 20° C. In some embodiments, the temperature interval size is between 0.5° C. and 10° C. In some embodiments, the temperature interval size is between 2° C. and 10° C. In some embodiments, the increments with which the temperature is increased or decreased are between 0.01 mV and 10 mV. In some embodiments, the increments with which the temperature is increased or decreased are between 0.1 mV and 2 mV. The stepwise approach may simplify the circuitry of driver circuit 121.

In some embodiments, the read voltage is reduced or increased according to a table-lookup. For example, a distinct voltage may be assigned for each 6° C. temperature interval. If the interval sizes are all equal and the voltage is varied by unit increments between intervals, this is essentially the stepwise approach. But the table-lookup allows the interval sizes to be varied. The table-lookup also allows for non-linear variations of voltage with temperature. In some embodiments, the table has 2 to 1000 rows. In some embodiments, the table has 5 to 200 rows. In some embodiments, the table has 10 to 100 rows. Using either table-lookup or variation in unit increments, the read voltage is selected from among a plurality of discrete values.

Figure 3C:
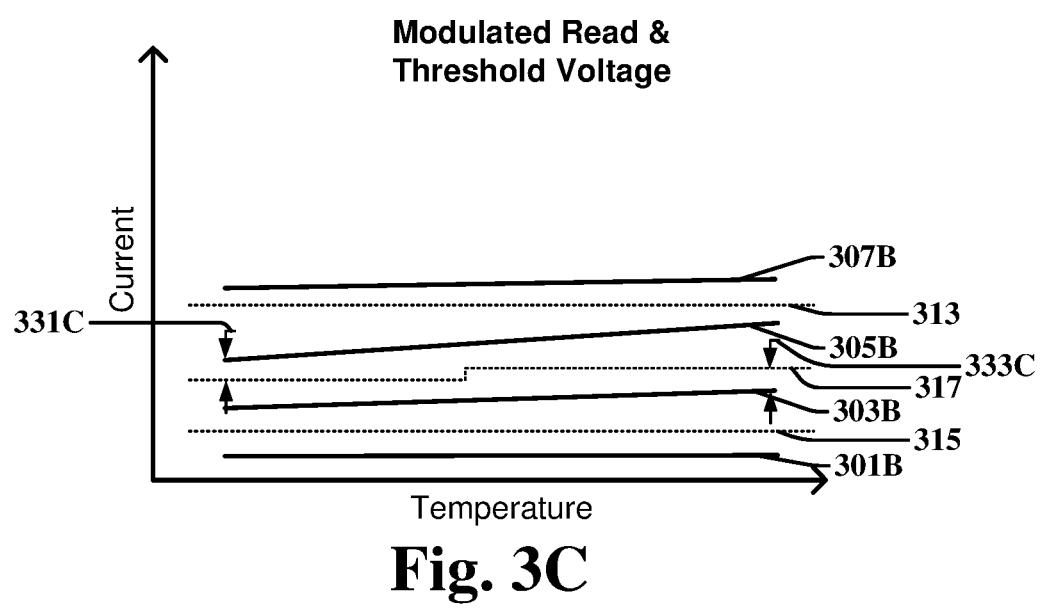
FIG. 3C is a plot showing how the programming states reflected by the read voltage of FIG. 2 can be more effectively distinguished with a reference current that is varied in accordance with some embodiments of the present disclosure.

Although the read currents of plots 301B, 303B, 305B, and 307B are shown as single value functions, these currents are in fact averages. Actual read currents may show a certain amount of scatter about these averages due to manufacturing and programming variations. This scatter may cause errors, particularly when a threshold currents approaches the read currents. For example, the read current of plot 305B comes to a minimum distance 331B of the threshold current 313 at a low end of the temperature range and the read current of plot 303B comes to a minimum distance 333B of the threshold current 313 at a high end of the temperature range. As shown in FIG. 3C, the minimum distance 331B may be increased significantly to the minimum distance 331C and the minimum distance 333B increased to the minimum distance 333C by replacing the threshold current 317 that has a first value for a lower end of the temperature range and a second value for a higher end of the temperature range.

The driver circuit 121 may be both a read driver and a write driver. The driver circuit 121 may support read, write, and write verify operations. A write verify operation may be essentially the same as a read operation except that it is applied automatically after a write operation to verify the success of that operation. A write operation is an operation that sets a programming state of in one or more of the memory cells $103_{a,1}$-$103_{d,4}$. For each programming state, there is a distinct temperature program (a temperature profile over a period of time) used to achieve that state. The temperatures may be achieved by applying suitable voltages to the memory cell $103_{a,1}$-$103_{d,4}$.

Figure 4:
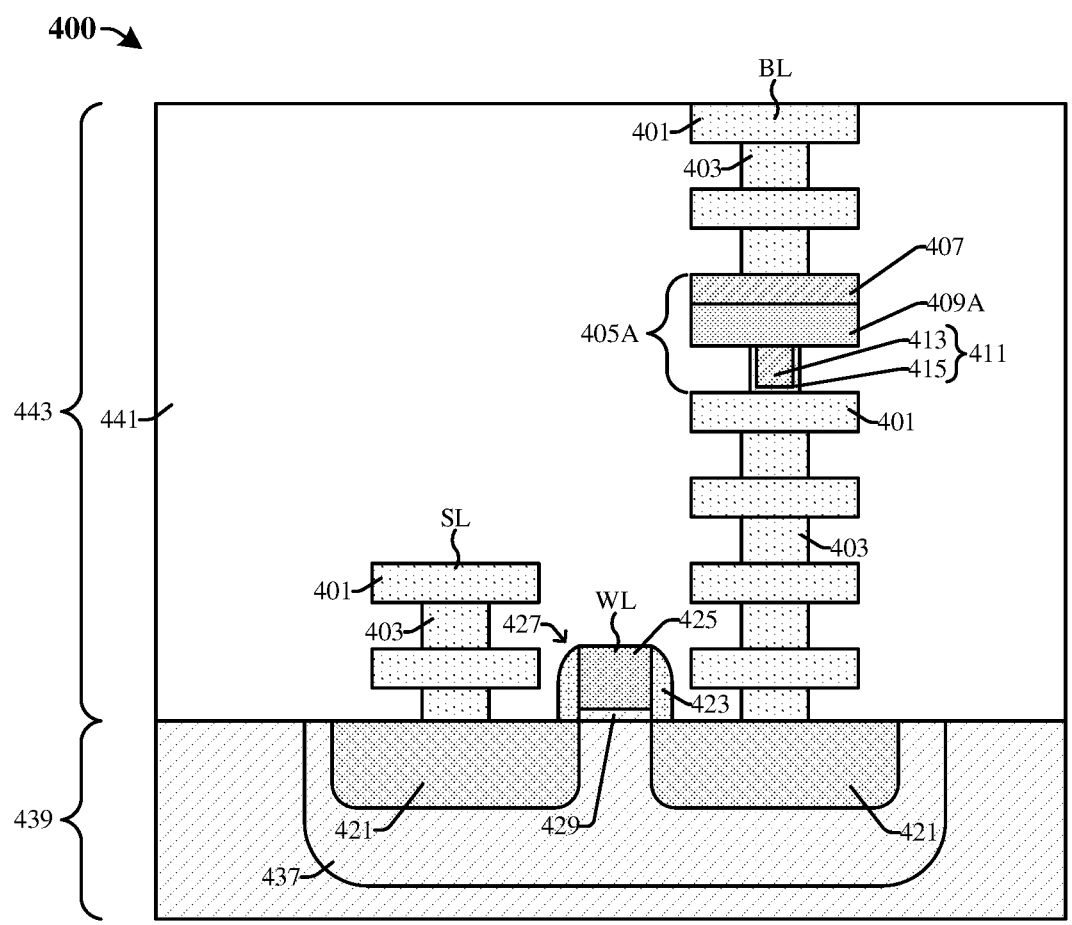
FIG. 4 illustrates a cross-sectional view of some embodiments of an integrated circuit having phase change memory cells and to which the present disclosure may be applied.

FIG. 4 illustrates a cross-sectional view of a portion of an integrated chip 400 that has a phase change memory array according to some embodiments of the present disclosure. The integrated chip 400 may be an embodiment of the integrated chip 100. The integrated chip 400 includes a metal interconnect structure 443 over a semiconductor substrate 439. A phase change memory cell 405A is formed within the metal interconnect structured 443. The metal interconnect structure 443 includes a plurality of conductive vias 403 and a plurality of conductive wires 401 disposed within a dielectric structure 441. An access selector apparatus 427 for the phase change memory cell 405A may be formed on the semiconductor substrate 439. The phase change memory cell 405A and the access selector apparatus 427 may correspond to one of the memory cells $103_{a,1}$-$103_{d,4}$.

The phase change memory cell 405A includes a bottom electrode 411, a top electrode 407, and a phase change element 409A disposed between the bottom electrode 411 and the top electrode 407. In some embodiments, the bottom electrode 411 has the form of a via. Bottom electrode 411 may include a conductive body 413 laterally surrounded by a conductive liner 415. In some embodiments, the bottom electrode 411 is operative as a heater to raise the temperature of the phase change element 409A for write and erase operations.

In some embodiments, the phase change element 409A is or comprises a chalcogenide glass. The chalcogenide glass may be or comprise, for example, at least one chalcogen (a chemical element in group 16 of the period table) or chalcogenide compound such as sulfur (S), selenium (Se), tellurium (Te), selenium sulfide (SeS), germanium antimony tellurium (GeSbTe), silver indium antimony tellurium (AgInSbTe), or the like. In some embodiments, the phase change element 409A is or comprises a germanium tellurium compound (GeTeX), an arsenic tellurium compound (AsTeX), or an arsenic selenium compound (AsSeX) where X may be, for example, germanium (Ge), silicon (Si), gallium (Ga), lanthanide (Ln), phosphorus (P), boron (B), carbon (C), nitrogen (N), oxygen (O), a combination of the foregoing, or the like.

The conductive body 413 and the top electrode 407 may be or comprise, for example, titanium, tantalum, tungsten, hafnium, a nitride of the foregoing (such as titanium nitride), a combination of the foregoing, or the like. The conductive body 413 and the top electrode 407 may be the same material or different materials. In some embodiments, the conductive liner 415 may be or comprise, for example, titanium, tantalum, tungsten, hafnium, a nitride of the foregoing (such as titanium nitride), a combination of the foregoing, or the like. The conductive liner 415 may function as an adhesion layer that maintains physical and electrical coupling between the conductive body 413 and an underlying conductive wire 401.

In some embodiments, the access selector apparatus 427 is a metal-oxide-semiconductor field effect transistor (MOSFET). The access selector apparatus 427 may include source/drain regions 421 formed in or on the semiconductor substrate 437, a gate dielectric 429, a gate electrode 425, and sidewall spacers 423. The gate dielectric 429 may be or comprise, for example, an oxide, such as silicon dioxide, a high-k dielectric material, another suitable dielectric material, or the like. The gate electrode 425 may be or comprise, for example, polysilicon, a metal material, such as aluminum, tungsten, titanium, or another suitable conductive material. The sidewall spacers may be or comprise, for example, silicon nitride, silicon carbide, or the like. The source/drain regions 421 may be of a first doping type (n-type or p-type) and may be formed within a well 437 of a second doping type opposite the first doping type.

The semiconductor substrate 439 may include any type of semiconductor body (e.g., silicon, SiGe, SOI), such as a semiconductor wafer and/or one or more dies on a wafer, or any other type of semiconductor and/or epitaxial layers, associated therewith. The dielectric structure 441 may comprise one or more interlevel dielectric (ILD) layers separated by etch stop layers and surrounding conductive wires 401, conductive vias 403, and the like. The ILD layers may comprise one or more dielectric materials, such as silicon dioxide ($SiO_2$), a low-κ dielectric such as a carbon-doped oxide of silicon (SiCOH), a fluorosilicate glass, a phosphate glass (e.g., borophosphate silicate glass), or the like. The conductive material forming conductive wires 401, conductive vias 403, and the like may be or comprise a metal (e.g., aluminum, copper, tungsten, or the like).

A first conductive wire 401 coupled to a first source/drain region 421 may provide a source-line (SL). The bottom electrode 411 of phase change memory cell 405A may be coupled to a second source/drain region 421. The top electrode 407A of phase change memory cell 405A may be coupled to a second conductive wire 401 that provides a bit-line (BL). The gate electrode 425 may provide a word-line (WL). In some embodiments, the SL is in the second metal interconnect level, although the SL may alternatively be in another metal interconnect level. In some embodiments, the phase change memory cell 405A is disposed between the fourth and the fifth metal interconnect level, although the phase change memory cell 405A may alternatively be disposed higher or lower within metal interconnect structure 443. In some embodiments, the BL is disposed in a metal interconnect level above the phase change memory cell 405A. Many other arrangements of these structures may also be used within the scope of the present disclosure.

While the integrated chip 400 uses a MOSFET as the access selector apparatus 427, many other types of access selector apparatus may be used. In some embodiments, the access selector apparatus 427 is a different type of transistor such as a bi-polar junction transistor or the like. In some embodiments, the access selector apparatus 427 is a unipolar selector that reduces the number of required connections for each of the memory cells $103_{a,1}$-$103_{d,4}$. In some embodiments, the unipolar selector is a diode (e.g., a PN diode, PiN diode, a Schottky diodes, an oxide semiconductor-oxide diode, or the like). In such embodiments, phase change memory cell 109 is accessed for read and write operations by applying voltages to the corresponding memory cell $103_{a,1}$-$103_{d,4}$ greater than a threshold value of the diode. In other embodiments, the unipolar selector is a filament based selector, rectifier, varistor-type selector, ovonic threshold switch (OTS), doped-chalcogenide-based selector, Mott effect based selector, mixed-ionic-electronic-conductive (MIEC)-based selector, field-assisted-superliner-threshold (FAST) selector, or the like.

The phase change element 409A has crystalline and amorphous states with drastically different electrical resistivity values. The crystalline and amorphous states may be used to represent different data states. More particularly, the phase change element 409A may be heated to a high temperature (e.g., over 600° C.), at which it loses its crystallinity. The phase change element 409A may then be quickly cooled or "quenched" to "freeze" the phase change element in an amorphous, high resistance state, which may correspond, for example, to a "0" data state (e.g., an erase of 'RESET' operation). Conversely, by heating the phase change element 409A to a lower temperature (e.g., about 100-150 degrees Celsius), wherein the lower temperature is above a crystallization point of phase change element 409A but below its melting point, the phase change element can be transformed into a low resistance state (i.e., crystalline state) which may correspond, for example, to a "1" state (e.g., programming the phase change memory cell or 'SET'). The temperature and time may also be controlled to provide partial crystallization, which may be used to represent additional distinct data states, whereby the phase change element 409A may provide a multi-level cell.

Figure 5:
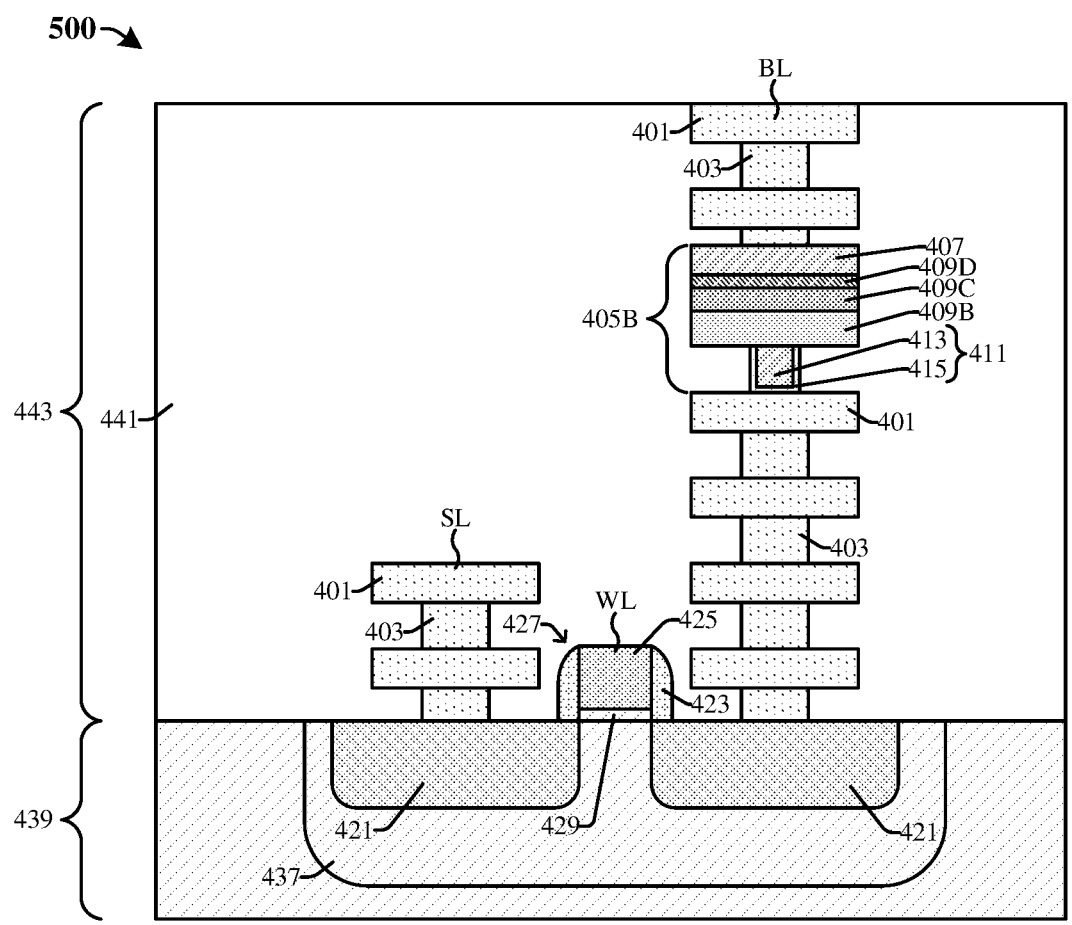
FIG. 5 illustrates a cross-sectional view of some embodiments of an integrated circuit having multi-level phase change memory cells and to which the present disclosure may be applied.

FIG. 5 illustrates a cross-sectional view of a portion of an integrated chip 500 that is the same as the integrated chip 400 except that it has a phase change memory cell 405B in place of the phase change memory cell 405A. The phase change memory cell 405B differs from the phase change memory cell 405A in that it has a first phase change element 409B, a second phase change element 409C, and a third phase change element 409D. Like the phase change element 409A, the phase change elements 409B-409D may each be or comprises a chalcogenide glass. They may be the same chalcogenide glasses or difference chalcogenide glass. Differences in composition, thickness, and distance from the bottom electrode 411 may be utilized to allow programming that leaves none, one, two, or all three of the phase change elements 409B-409D in crystalline form representing four different configurations that provide two bits of data. Regardless of the structure employed, a multi-level cell having n-bits of data has 2n distinct resistance levels that may be distinguished in terms of 2n-1 thresholds. Reliable reading of the programing state (resistance level) may be enhanced by temperature modulation of the read voltage according to the present disclosure.

The temperature sensing circuit 123 may obtain temperatures from any suitable type of temperature sensor at any suitable location. In some embodiments, temperature sensing circuit 123 include a temperature sensor that includes a first doped region (not shown) of the semiconductor substrate 439 and a second doped region (not shown) of the semiconductor substrate 439. The first and second doped regions respectively have first and second doping types and contact one another to define a PN-junction. In some embodiments, the first and second doped regions may extend from a top surface of the semiconductor substrate 439 to the bottom surface of the semiconductor substrate 439. In some other embodiments, the temperature sensor comprises a layer of material (not shown) with a resistance that varies predictably in response to temperature variation, such as a layer of doped polysilicon or the like.

While the examples have focused on phase change random access memory (PcRAM), the structures and methods of the present disclosure are applicable to other types, for examples, the memory including, without limitation, resistive random-access memory (ReRAM), oxygen displacement memory (OxRAM), conductive bridging random access memory (CBRAM), magnetoresistive random access memory (MRAM), ferroelectric random access memory (FRAM), phase-change memory (PCM), carbon nanotube random access memory (NRAM), and the like.

Figure 6:
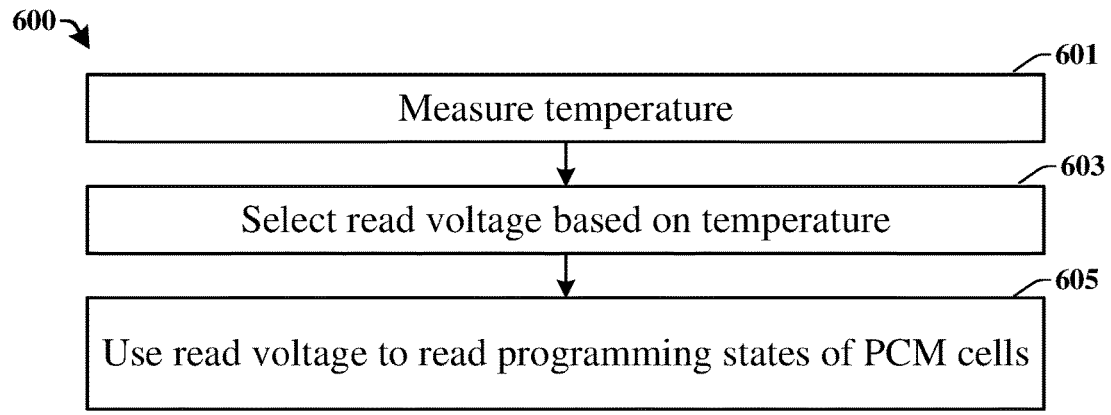
FIG. 6 is a flow chart illustrating a method according to some embodiments of the present disclosure.

FIG. 6 illustrates a method 600 for operating an integrated chip 100, 400, 500 according to the present disclosure. The method 600 includes act 601 measuring a temperature that is an approximate temperature of the memory array 101, act 603, selecting a read voltage based on the measured temperature, and act 605, using the selected read voltage to read programming states of one or more memory cells $103_{a,1}$-$103_{d,4}$. The read voltage is selected to ameliorate a temperature dependent variation in a current through one of the memory cells $103_{a,1}$-$103_{d,4}$ when that memory cell $103_{a,1}$-$103_{d,4}$ is in some particular resistance state. Reading the programming state of one of the memory cells $103_{a,1}$-$103_{d,4}$ may include applying the selected voltage to the memory cells $103_{a,1}$-$103_{d,4}$ and comparing the resulting current through the memory cells $103_{a,1}$-$103_{d,4}$ to one or more threshold values. In some embodiments, one or more of the one or more threshold values is also adjusted based on the temperature.

The temperature sensor can be any device that has a resistance that varies systematically with temperature. A phase change memory cell in a fixed programming state is such a device. A phase change memory cell may maintain its programming state for more than 100 years. Accordingly, the integrated chip 100 may include phase change memory cells that are programmed at the conclusion of a manufacturing process and then used as reference cells to determine read voltages that ameliorate temperature dependent variation in read currents. The reference cells, or like devices, may be used to sense temperature changes and adjust read voltages to ameliorate temperature-dependent variations in current without specifically determining temperature values or measuring temperature in a narrow sense.

Figure 7:
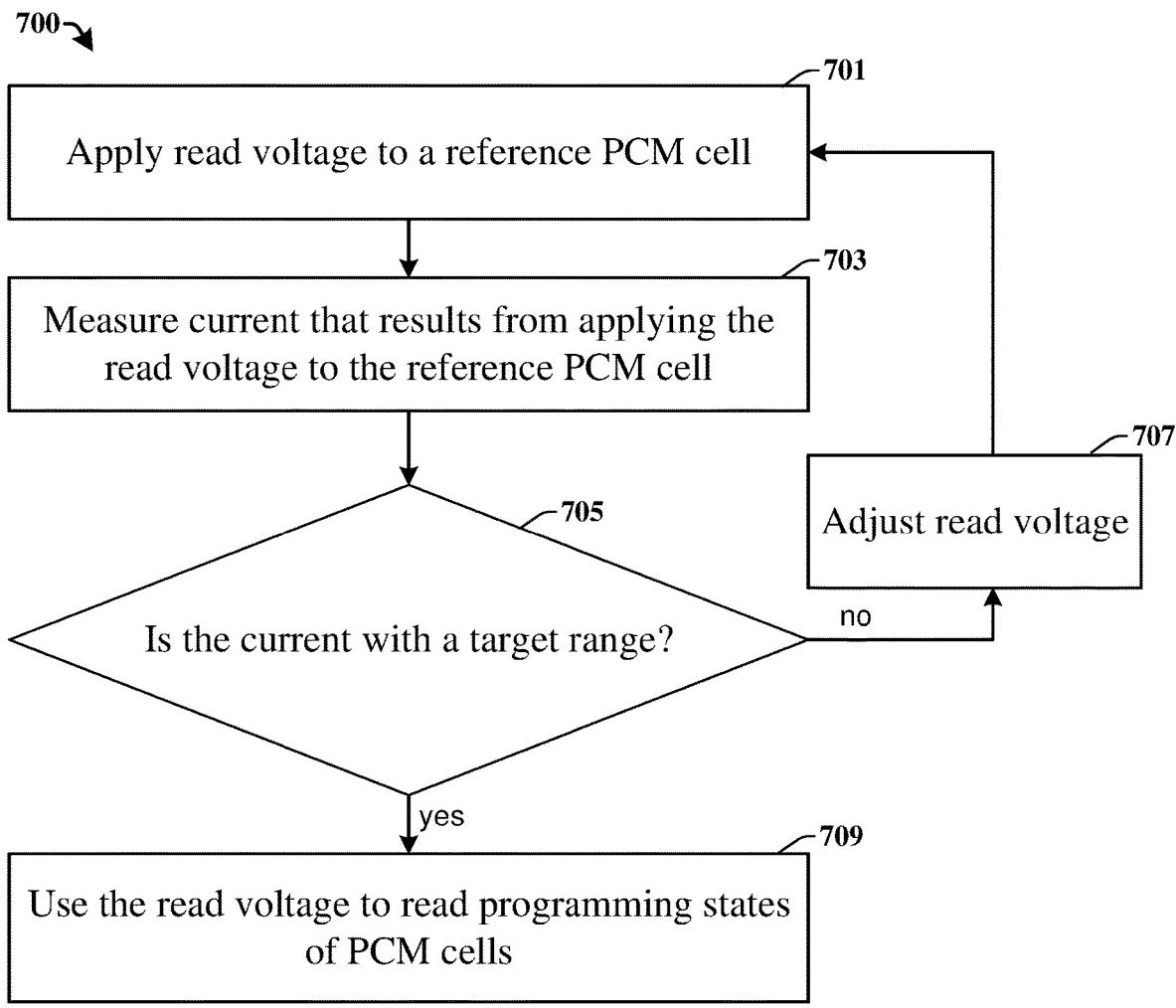
FIG. 7 is a flow chart illustrating a method according to some other embodiments of the present disclosure.

FIG. 7 provides an example method 700 that uses phase change memory reference cells to adjust read voltages in response to temperature changes without making specific temperature measurements. The method 700 may begin with act 701, applying an initial value of a read voltage to a reference phase change memory cell. Act 703 is measuring the resulting current through the reference phase change memory cell. Act 705 is determining whether the current is within a pre-determined target range. If the current is outside the target range, the method 700 proceeds with act 707, adjusting the read voltage. If the current is above the target range, act 707 reduces the read voltage. If the current is below the target range, act 707 increases the read voltage. After adjusting the read voltage in act 707, method 700 returns to act 701. Acts 701-707 constitute a feed-back control loop that continues until the current is within the target range. Once the current is within the target range, the method continues with act 709, applying the read voltage to read the programming states of one or more memory cells $103_{a,1}$-$103_{d,4}$.

Some aspects of the present teachings relate to an integrated chip having a semiconductor substrate, a driver circuit, and an array of resistive random access memory cells formed over the semiconductor substrate. The driver circuit is configured to provide selected cells in the array with a read voltage that varies selectively in relation to a temperature of array. The memory cells may be multi-level phase change memory cells.

Some aspects of the present teachings relate to an integrated chip having a semiconductor substrate, an array of phase change memory cells formed over the semiconductor substrate, and a temperature sensor positioned to measure an approximate temperature of the array of phase change memory cells. A circuit disposed on the semiconductor substrate is operative to select a read voltage for the phase change memory cells according to the approximate temperature.

Some aspects of the present teachings relate to a method of operating phase change memory. The method includes selecting a voltage for reading states of cells in a phase change memory array and applying the voltage to read states of cells in the phase change memory array. The method further includes adjusting the voltage in a manner that results in an increase in the voltage if a temperature of the phase change memory array has dropped and a decrease in the voltage if a temperature of the phase change memory array has risen.

Some aspects of the present teachings relate to a method of operating phase change memory. The method includes generating a first read voltage while a phase change memory is at a first temperature then driving a cell in the phase change memory array with the first read voltage. Subsequently, while the phase change memory is at a second temperature, a temperature-compensated read voltage is selected. A read current is produced by driving a second cell in the phase change memory array with the temperature-compensated read voltage. A programming state of the second cell by comparing the read current to one or more threshold values. In this method, the temperature-compensated read voltage is made higher when a difference between the second temperature and the first temperature has made a resistance of the second cell higher and the temperature-compensated read voltage is made lower when the difference between the second temperature and the first temperature has made the resistance of the second cell lower.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purpo.ses and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of operating phase change memory, comprising:
    generating a first read voltage while a phase change memory array is at a first temperature;
    driving a cell in the phase change memory array with the first read voltage;
    generating a temperature-compensated read voltage while the phase change memory array is at a second temperature;
    generating a read current by driving a second cell in the phase change memory array with the temperature-compensated read voltage; and
    determining a programming state of the second cell by comparing the read current to one or more threshold values;
    wherein the temperature-compensated read voltage is made higher when a difference between the second temperature and the first temperature has made a resistance of the second cell higher and the temperature-compensated read voltage is made lower when the difference between the second temperature and the first temperature has made the resistance of the second cell lower.

2. The method of claim 1, wherein the temperature-compensated read voltage is selected based on one or more temperature measurements.

3. The method of claim 1, further comprising:
    applying the first read voltage to a third cell in the phase change memory array or to a phase change memory cell outside the array;
    comparing a resulting current through the third cell to a target current range;
    selecting the temperature-compensated read voltage to be lower than the first read voltage when the resulting current is above the target current range; and
    selecting the temperature-compensated read voltage to be higher than the first read voltage when the resulting current is below the target current range.

4. The method of claim 1, further comprising:
    using a temperature sensing circuit to determine the first temperature; and using the temperature sensing circuit to determine the second temperature.

5. The method of claim 4, wherein the temperature sensing circuit comprises a temperature sensor in a semiconductor substrate.

6. The method of claim 4, wherein the temperature sensing circuit determines an approximate temperature of the phase change memory array.

7. The method of claim 1, wherein determining the programming state of the second cell distinguishes among four or more possible programming states for the second cell.

8. The method of claim 1, wherein the cell comprises a chalcogenide glass.

9. The method of claim 8, wherein the cell comprises a plurality of chalcogenide glass layers.

10. The method of claim 1, further comprising:
applying the first read voltage to a reference phase change memory cell to produce an output;
wherein generating the temperature-compensated read voltage is dependent on the output.

11. The method of claim 1, further comprising:
applying the first read voltage to a reference phase change memory cell;
measuring a current that results from applying the first read voltage to the reference phase change memory cell; and
generating the temperature-compensated read voltage when the current is outside a target range.

12. The method of claim 1, further comprising determining the temperature-compensated read voltage by a table lookup.

13. The method of claim 12, wherein the second temperature provides an index for the table lookup.

14. The method of claim 1, further comprising selecting one of the one or more threshold values based on the second temperature.

15. The method of claim 1, further comprising:
generating a third read voltage while the phase change memory array is at a third temperature; and
generating a second read current by driving the second cell in the phase change memory array with the third read voltage; and
wherein the temperature-compensated read voltage is higher than the first read voltage by a predetermined increment; and
the third read voltage is higher than the temperature-compensated read voltage by the predetermined increment.

16. The method of claim 1, wherein comparing the read current to one or more threshold values comprises mirroring the read current with a current mirror circuit.

17. A method of operating phase change memory, comprising:
generating a first read voltage while a phase change memory array is at a first temperature;
driving a cell in the phase change memory array with the first read voltage;
generating a temperature-compensated read voltage while the phase change memory array is at a second temperature;
generating a read current by driving a second cell in the phase change memory array with the temperature-compensated read voltage; and
determining a programming state of the second cell by comparing the read current to one or more threshold values;
wherein the temperature-compensated read voltage is made higher when a difference between the second temperature and the first temperature has made a resistance of the second cell higher and the temperature-compensated read voltage is made lower when the difference between the second temperature and the first temperature has made the resistance of the second cell lower; and
the temperature-compensated read voltage is higher or lower than the first read voltage by a predetermined increment.

18. A method of operating phase change memory, comprising:
generating a first read voltage while a phase change memory array is at a first temperature;
driving a cell in the phase change memory array with the first read voltage;
generating a temperature-compensated read voltage while the phase change memory array is at a second temperature;
generating a read current by driving a second cell in the phase change memory array with the temperature-compensated read voltage; and
determining a programming state of the second cell by comparing the read current to one or more threshold values;
wherein the temperature-compensated read voltage is made higher when a difference between the second temperature and the first temperature has made a resistance of the second cell higher and the temperature-compensated read voltage is made lower when the difference between the second temperature and the first temperature has made the resistance of the second cell lower; and
the temperature-compensated read voltage is selected from a plurality of discrete voltages.

19. The method of claim 18, wherein each of the discrete voltages corresponds to a distinct range for the second temperature.

20. The method of claim 18, wherein the plurality of discrete voltages are stored in a table.

* * * * *